United States Patent
Yip

(10) Patent No.: US 9,767,909 B1
(45) Date of Patent: Sep. 19, 2017

(54) MEMORY CELL PROGRAMMING UTILIZING CONDITIONAL ENABLING OF MEMORY CELLS

(71) Applicant: MICRON TECHNOLOGY, INC., Boise, ID (US)

(72) Inventor: Aaron S. Yip, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/072,954

(22) Filed: Mar. 17, 2016

(51) Int. Cl.
G11C 11/34 (2006.01)
G11C 16/04 (2006.01)
G11C 16/10 (2006.01)
G11C 16/26 (2006.01)

(52) U.S. Cl.
CPC .............. *G11C 16/10* (2013.01); *G11C 16/26* (2013.01)

(58) Field of Classification Search
None
See application file for complete search history.

(56) References Cited

U.S. PATENT DOCUMENTS

| | | | |
|---|---|---|---|
| 6,538,923 B1* | 3/2003 | Parker | G11C 11/5628 365/185.03 |
| 8,953,386 B2* | 2/2015 | Dutta | G11C 11/5628 365/185.28 |
| 2008/0037327 A1* | 2/2008 | Park | G11C 8/08 365/185.19 |
| 2010/0202211 A1* | 8/2010 | Park | G11C 16/24 365/185.19 |
| 2014/0169068 A1* | 6/2014 | Lee | G11C 13/0064 365/148 |
| 2015/0357031 A1 | 12/2015 | Tang et al. | |
| 2016/0005491 A1* | 1/2016 | Yuan | G11C 11/5642 365/185.02 |

* cited by examiner

*Primary Examiner* — Son Dinh
*Assistant Examiner* — Sultana Begum
(74) *Attorney, Agent, or Firm* — Dicke, Billig & Czaja, PLLC

(57) ABSTRACT

Methods of operating a memory include determining indications of programming voltages sufficient to program respective groups of memory cells of a plurality of groups of memory cells to a particular range of threshold voltages, applying a stepped programming pulse to a selected access line connected to each memory cell of the plurality of groups of memory cells, and enabling each group of memory cells for programming when a voltage level of the stepped programming pulse corresponds to the respective indication of the programming voltage sufficient to program that group of memory cells to the particular range of threshold voltages.

20 Claims, 12 Drawing Sheets

US 9,767,909 B1

MEMORY CELL PROGRAMMING UTILIZING CONDITIONAL ENABLING OF MEMORY CELLS

TECHNICAL FIELD

The present disclosure relates generally to memory and, in particular, in one or more embodiments, the present disclosure relates to memory cell programming.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory include personal computers, personal digital assistants (PDAs), digital cameras, digital media players, cellular telephones, solid state drives and removable memory modules, and the uses are growing.

Programming in memories is typically accomplished by applying a plurality of programming pulses, separated by verify pulses, to program each memory cell of a selected group of memory cells to a respective intended data state (which may be an interim or final data state). With such a scheme, the programming pulses are applied to access lines, such as those typically referred to as word lines, for selected memory cells. After each programming pulse, one or more verify pulses are used to verify the programming of the selected memory cells. Current programming typically uses many programming pulses in an incremental step pulse programming scheme, where each programming pulse is a single pulse that moves the memory cell threshold voltage by some amount. Before each programming pulse, word lines may be precharged, and after each programming pulse, the word lines may be discharged. This can lead to high power consumption.

For the reasons stated above, and for other reasons stated below which will become apparent to those skilled in the art upon reading and understanding the present specification, there is a need in the art for alternative methods of operating memory, and apparatus to perform such methods.

DETAILED DESCRIPTION

Figure 1:
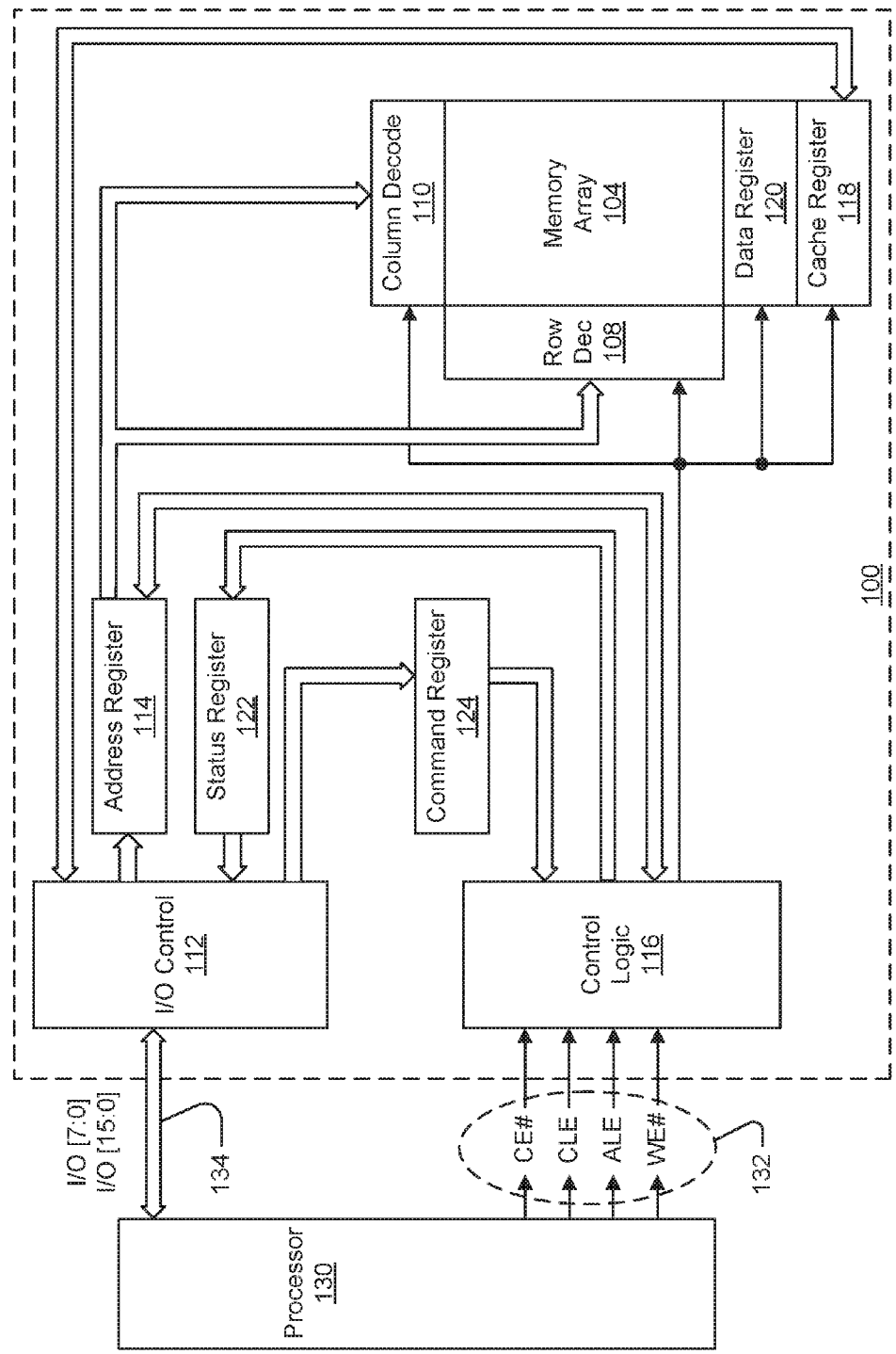
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. A block of memory cells may include those memory cells that are configured to be erased together, such as all memory cells connected to word lines $202_0$-$202_N$ (e.g., all NAND strings 206 sharing common word lines 202). Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations (e.g., programming operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118 and data register 120. Cache register 118 latches data, either incoming or outgoing, as directed by control logic 116 to temporarily store data while the array of memory cells 104 is busy writing or reading, respectively, other data. During a programming operation (e.g., often referred to as a write operation), data is passed from the cache register 118 to the data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
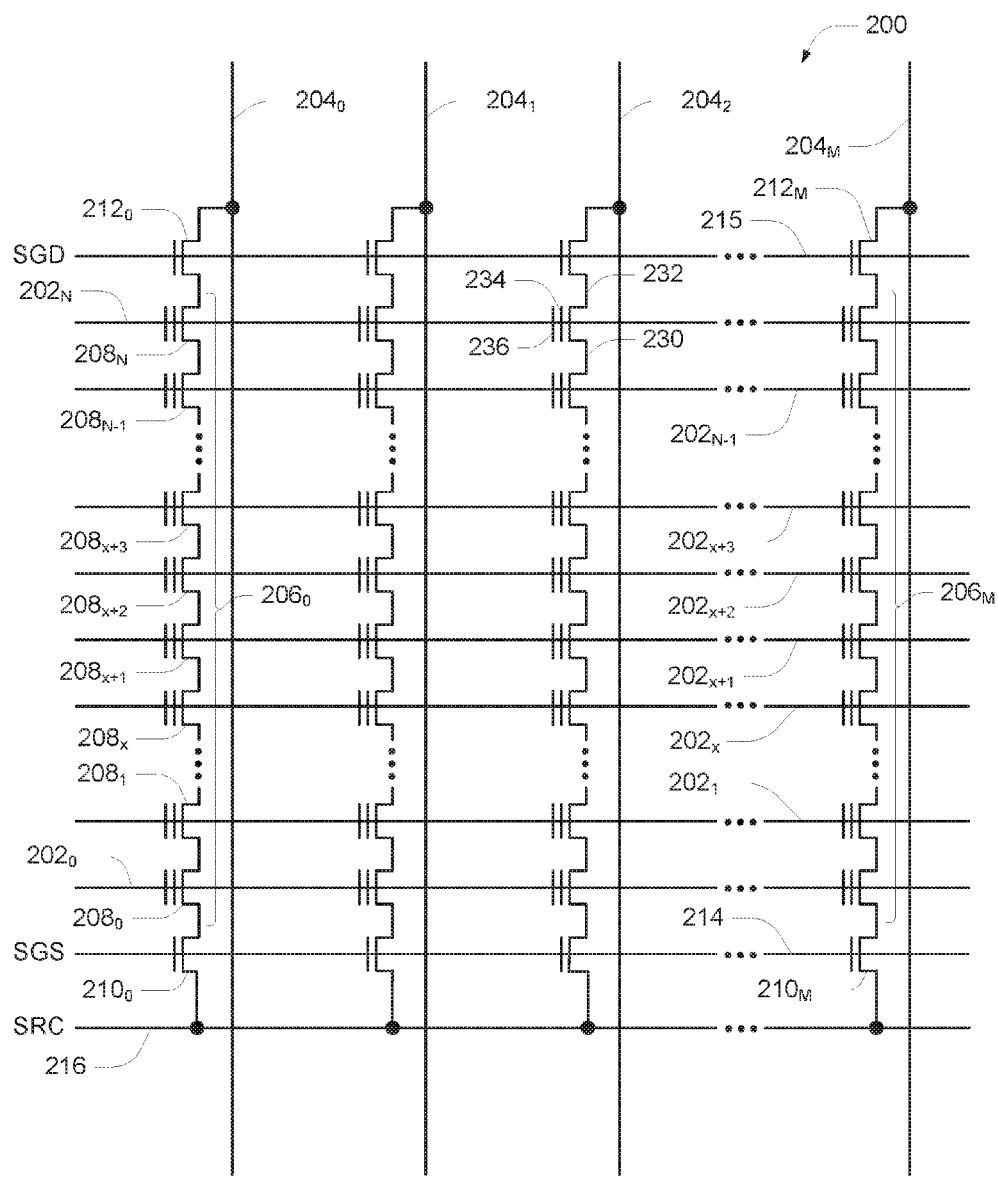
FIG. 2 is a schematic of a portion of an array of memory cells as could be used in a memory of the type described with reference to FIG. 1.

FIG. 2 is a schematic of a NAND memory array 200, e.g., as a portion of array of memory cells 104. Memory array 200 includes access lines, such as word lines $202_0$ to $202_N$, and data lines, such as bit lines $204_0$ to $204_M$. The word lines 202 may be connected to global access lines (e.g., global word lines), not shown in FIG. 2, in a many-to-one relationship. For some embodiments, memory array 200 may be formed over a semiconductor that, for example, may be conductively doped to have a conductivity type, such as a p-type conductivity, e.g., to form a p-well, or an n-type conductivity, e.g., to form an n-well.

Memory array 200 might be arranged in rows (each corresponding to a word line 202) and columns (each corresponding to a bit line 204). Each column may include a string of series-connected memory cells, such as one of NAND strings $206_0$ to $206_M$. Each NAND string 206 might be connected (e.g., selectively connected) to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly connected to a select line 214, such as a source select line, and select transistors $212_0$ to $212_M$ might be commonly connected to a select line 215, such as a drain select line.

A source of each select transistor 210 might be connected to common source 216. The drain of each select transistor 210 might be connected to a memory cell $208_0$ of the corresponding NAND string 206. For example, the drain of select transistor $210_0$ might be connected to memory cell $208_0$ of the corresponding NAND string $206_0$. Therefore, each select transistor 210 might be configured to selectively connect a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to a memory cell $208_N$ of the corresponding NAND string 206. For example, the source of select transistor $212_0$ might be connected to memory cell $208_N$ of the corresponding NAND string $206_0$. Therefore, each select transistor 212 might be configured to selectively connect a corresponding NAND string 206 to a corresponding bit line 204. A control gate of each select transistor 212 might be connected to select line 215.

The memory array in FIG. 2 might be a quasi-two-dimensional memory array and might have a generally planar structure, e.g., where the common source 216, NAND strings 206 and bit lines 204 extend in substantially parallel planes. Alternatively, the memory array in FIG. 2 might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2. In some cases, memory cells 208 may further have a defined source 230 and a defined drain 232. Memory cells 208 have their control gates 236 connected to (and in some cases form) a word line 202.

A column of the memory cells 208 is a NAND string 206 or a plurality of NAND strings 206 selectively connected to a given bit line 204. A row of the memory cells 208 are memory cells 208 commonly connected to a given word line 202. A row of memory cells 208 can, but need not include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2, it is apparent from the figure that the bit lines 204 of the array of memory cells 200 may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page. The portion of a physical page (which, in some embodiments, could still be the entire row) that is read during a single read operation or programmed during a programming operation (e.g., an upper or lower page memory cells) might be deemed a logical page.

Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Memory cells may be configured to operate as what are known in the art as single-level memory cells (SLC) or multi-level memory cells (MLC). SLC and MLC memory cells assign a data state (e.g., representing a respective value of one or more bits) to a specific range of threshold voltages (Vt) stored on the memory cells. Single level memory cells (SLC) permit the storage of a single binary digit (e.g., bit) of data on each memory cell. Meanwhile, MLC technology permits the storage of more than one binary digit per memory cell (e.g., two bits, three bits, four bits, etc.), depending on the quantity of threshold voltage ranges assigned to the memory cell and the stability of the assigned threshold voltage ranges during the lifetime operation of the memory cell. By way of example, one bit (e.g., 1 or 0) may be represented by two threshold voltage ranges, two bits by four ranges, three bits by eight ranges, etc. Non-binary numbers of threshold voltage ranges are also known, e.g., using two memory cells configured to operate with three data states to collectively store three bits of information, or 1.5 bits per memory cell.

Programming typically involves applying one or more programming pulses (Vpgm) to a selected word line and thus to the control gates of the row of memory cells coupled to the selected word line. Typical programming pulses (Vpgm) may start at or near 15V and tend to increase in magnitude during each programming pulse application. While the program potential (e.g., voltage level of the programming pulse) is applied to the selected word line, an enable voltage, such as a ground potential (e.g., 0V), is applied to the channels of memory cells selected for programming, i.e., those memory cells for which the programming operation is intended to shift their data state to some higher level. This may result in a charge transfer from the channel to the charge storage structures of these selected memory cells. For example, floating gates are typically charged through direct injection or Fowler-Nordheim tunneling of electrons from the channel to the floating gate, resulting in a threshold voltage typically greater than zero in a programmed state.

An inhibit voltage (e.g., Vcc) is typically applied to bit lines which are selectively connected to a NAND string containing a memory cell that is not selected for programming. In addition to bit lines selectively connected to memory cells already at their intended data state, these unselected bit lines may further include bit lines that are not addressed by the programming operation. For example, a logical page of data may correspond to memory cells coupled to a particular word line and selectively connected to some particular subset of the bit lines (e.g., every other bit line), such that the remaining subset of bit lines would be unselected for the programming operation and thus inhibited.

Between the application of one or more programming (e.g., Vpgm) pulses, a verify operation is typically performed to check each selected memory cell to determine if it has reached its intended data state. If a selected memory cell has reached its intended data state it is inhibited from further programming if there remain other selected memory cells still requiring additional programming pulses to reach their intended data states. Following a verify operation, an additional programming pulse (Vpgm) may be applied if there are memory cells that have not completed programming. This process of applying a programming pulse followed by performing a verify operation (e.g., a program-verify phase of a programming operation) typically continues until all the selected memory cells have reached their intended data states. If a particular number of programming pulses (e.g., maximum number) have been applied and one or more selected memory cells still have not completed programming, those memory cells might be marked as defective, for example. Various embodiments seek to reduce a number of these program-verify phases of a programming operation.

Figure 3:
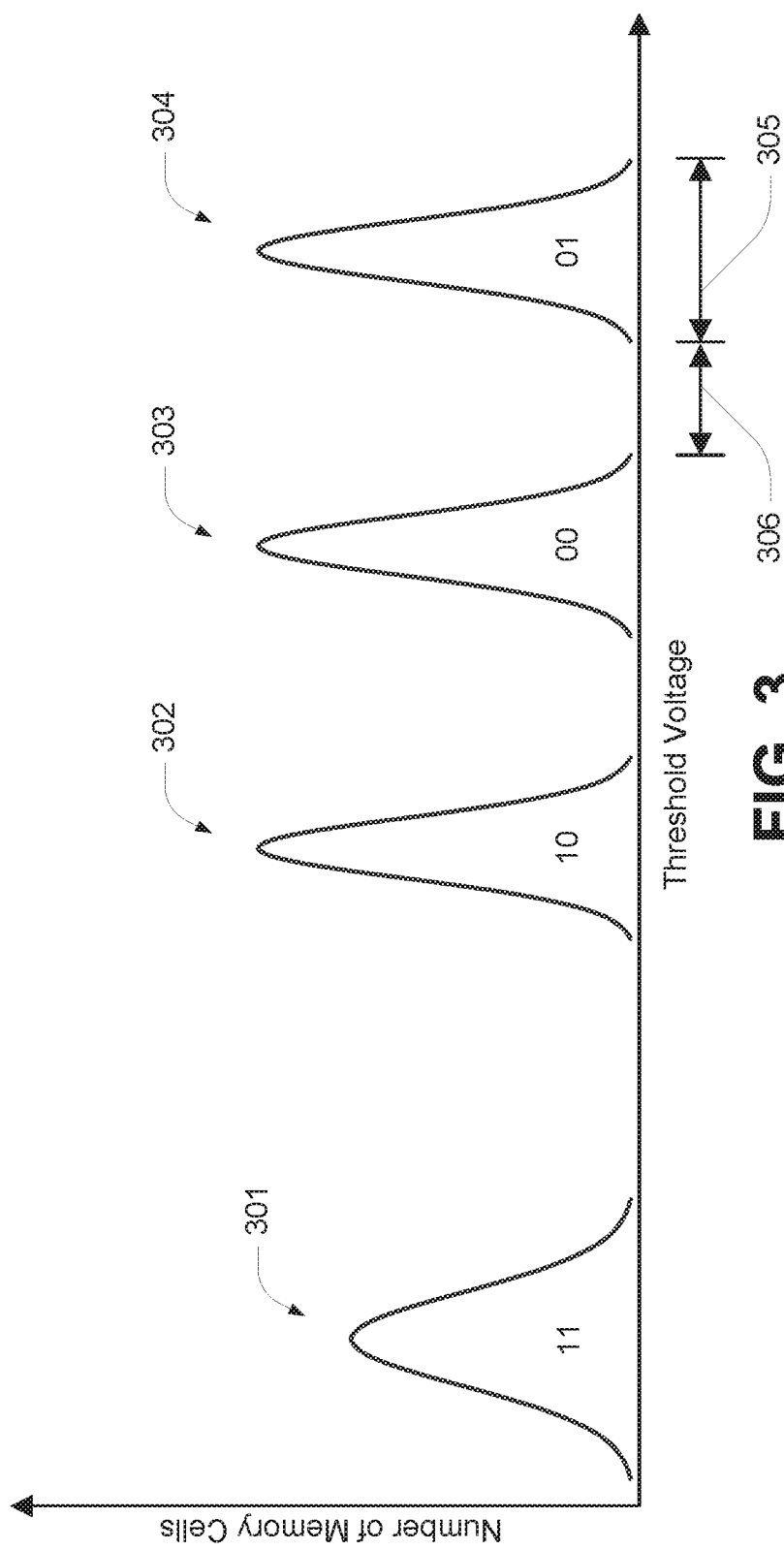
FIG. 3 illustrates an example of threshold voltage ranges for a population of multi-level memory cells.

FIG. 3 illustrates an example of threshold voltage ranges for a population of a four-level (e.g., two-bit) MLC memory cells. For example, such a memory cell might be programmed to a threshold voltage (Vt) that falls within one of four different threshold voltage ranges 301-304, each being used to represent a data state corresponding to a bit pattern comprised of two bits. The threshold voltage range 301 typically has a greater width than the remaining threshold voltage ranges 302-304 as memory cells are generally all placed in the data state corresponding to the threshold voltage range 301, then subsets of those memory cells are subsequently programmed to have threshold voltages in one of the threshold voltage ranges 302-304. As programming operations are generally more incrementally controlled than erase operations, these threshold voltage ranges 302-304 may tend to have tighter distributions.

The threshold voltage ranges 302-304 might each have a width 305, e.g., a width of 750 mV. In addition, a dead space 306 (e.g., sometimes referred to as a margin, and might be approximately 500 mV or greater) is typically maintained between adjacent threshold voltage ranges 301-304 to keep the threshold voltage ranges from overlapping. As an example, if the threshold voltage of a memory cell is within the first of the four threshold voltage ranges 301, the memory cell in this case is storing a logical '11' data state and is typically referred to as the erased state of the memory cell. If the threshold voltage is within the second of the four threshold voltage ranges 302, the memory cell in this case is storing a logical '10' data state. A threshold voltage in the third threshold voltage range 303 would indicate that the memory cell in this case is storing a logical '00' data state. Finally, a threshold voltage residing in the fourth threshold voltage range 304 indicates that a logical '01' data state is stored in the memory cell.

Various embodiments may utilize a determination of a relationship between an applied voltage level (e.g., a gate voltage Vg) across a memory cell to its resulting threshold voltage as an indication of a programming voltage sufficient to program a memory cell, or group of memory cells, to a particular threshold voltage, or range of threshold voltages. This relationship may be referred to as VgVt and represents a difference between the applied voltage level across a memory cell and its resulting threshold voltage. For example, if a voltage level of 13 volts is applied to a control gate of a memory cell whose body (e.g., channel) is at a ground potential (e.g., 0 volts), and the resulting threshold voltage is −0.5 volt, the VgVt for that memory cell is (13 volts−0 volts)−(−0.5 volts)=13.5 volts.

It is expected that the VgVt relationship as a function of intended threshold voltage might be deemed to be linear within normal operation of a memory cell, and may have a positive slope, such that the VgVt at a threshold voltage of 0.5 volts for the same memory cell might be expected to be greater than 13.5 volts. The VgVt relationship to threshold voltage might be more accurately described by a polynomial equation. Regardless, the VgVt relationship for a particular memory as a function of threshold voltage (e.g., the slope of a line, the constants of a polynomial or other characterization) might be determined empirically, based on knowledge of the structure and materials of the memory cells, or directly through experimentation. For example, programming pulses of various voltage levels can be applied to one or more memory cells, and the resulting threshold voltages can be determined after each of these programming pulses. A composite function could be fitted from the individual responses of these memory cells. A function could be determined for a memory array as a whole, or individual functions might be determined on some sub-portion of the memory array, e.g., by block of memory cells.

Once a VgVt value for a particular threshold voltage is determined for a particular memory cell, the VgVt value for a different threshold voltage can be calculated (e.g., corrected) by fitting the function to the known value. To continue the foregoing example, if the relationship is deemed to be linear with a slope (e.g., $\Delta VgVt/\Delta Vt$) of 0.2, and the VgVt at a threshold voltage of −0.5 volts is 13.5 volts, the VgVt at a threshold voltage of 0.5 volts might be expected to be 13.7 volts. Accordingly, a programming voltage (e.g., the programming voltage across the memory cell) of 14.2 volts might be expected to result in a threshold voltage of 0.5 volts for that memory cell. Where a non-linear function is utilized, the function could define the change in VgVt value from the measured threshold voltage of a memory cell to the intended threshold voltage of that memory cell, and this $\Delta VgVt$ could be added to the determined VgVt of that memory cell at its measured threshold voltage in order to calculate the VgVt value of that memory cell at its intended threshold voltage.

Figure 4:
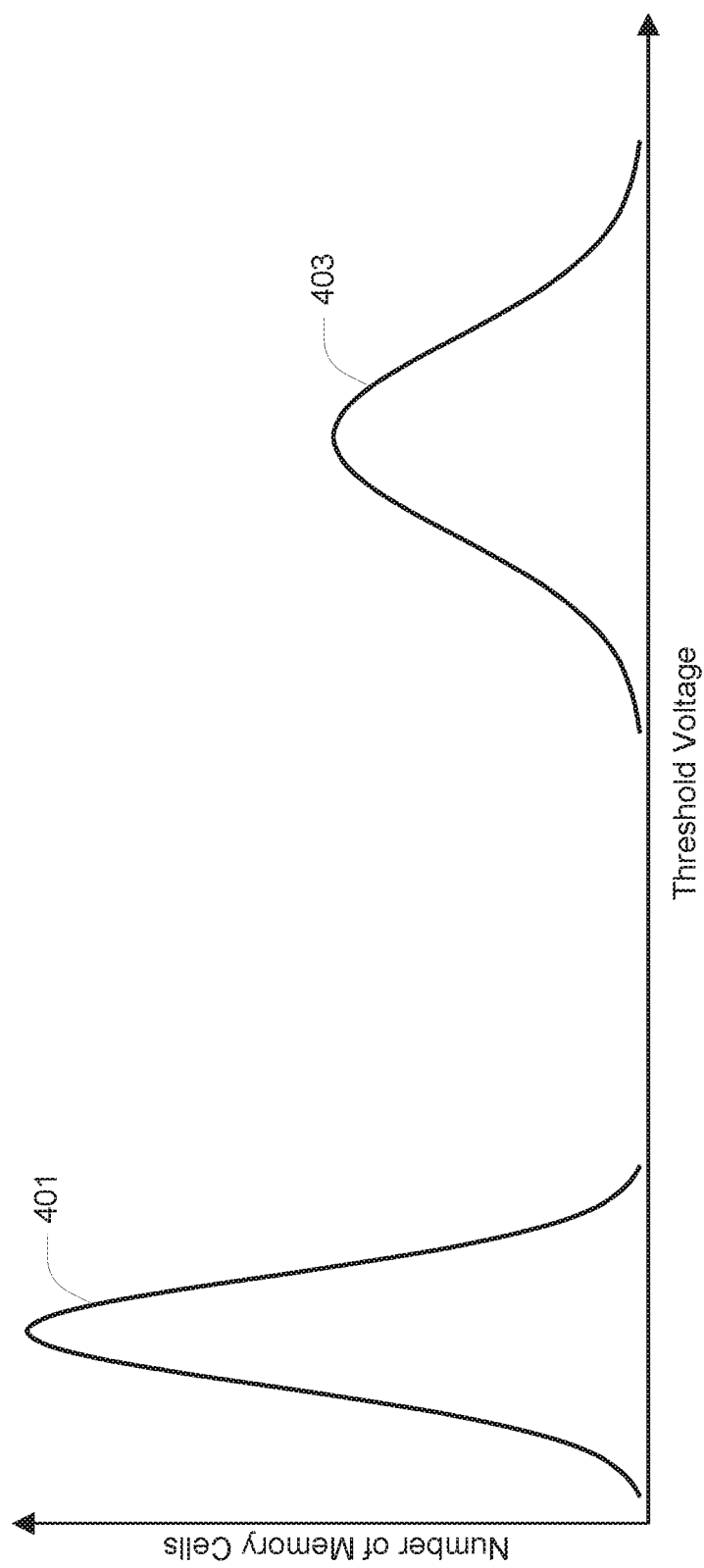
FIG. 4 depicts a shift in threshold voltage distribution following application of a programming pulse to a number of memory cells according to an embodiment.

FIG. 4 depicts a shift in threshold voltage distribution following application of a programming pulse (e.g., a discovery programming pulse) to a number of memory cells for use with various embodiments. For example, the memory cells of the distribution of threshold voltages 401 might be in an initial data state, e.g., the erased data state. The memory cells of the distribution of threshold voltages 401 might be those memory cells selected for programming during a programming operation. If a programming pulse, e.g., having some positive voltage level relative to the channels of the selected memory cells, is applied to the access line (e.g., word line) connected to the memory cells of distribution of threshold voltages 401, they might be expected to experience an increase in threshold voltage, resulting in the distribution of threshold voltages 403. Note that the distribution of threshold voltages 403 may be wider than distribution of threshold voltages 401.

The voltage level of this discovery programming pulse may be chosen to be expected to produce the distribution of threshold voltages 403 to have a range of threshold voltages that are each less than a range of threshold voltages corresponding to a data state (e.g., intended data state) to which the memory cells of distribution of threshold voltages 403 are to be programmed. The voltage level of this discovery programming pulse might be determined empirically, based on knowledge of the structure and materials of the memory cells, or directly through experimentation. In one example, a programming pulse of 13 volts across a memory cell might produce a distribution of threshold voltages 403 having a width of approximately 4 volts Some portion (e.g., less than all or all) of the distribution of threshold voltages 403 may correspond to negative threshold voltages.

The voltage level of the discovery programming pulse may be further dependent upon the intended data state for a programming operation. For example, the discovery programming pulse might have a first voltage level for programming operations to bring memory cells to the data state corresponding to the distribution of threshold voltages 302 of FIG. 3, the discovery programming pulse might have a second (e.g., higher) voltage level for programming operations to bring memory cells to the data state corresponding to the distribution of threshold voltages 303 of FIG. 3, and the discovery programming pulse might have a third (e.g., higher) voltage level for programming operations to bring memory cells to the data state corresponding to the distribution of threshold voltages 304 of FIG. 3.

Figure 5:
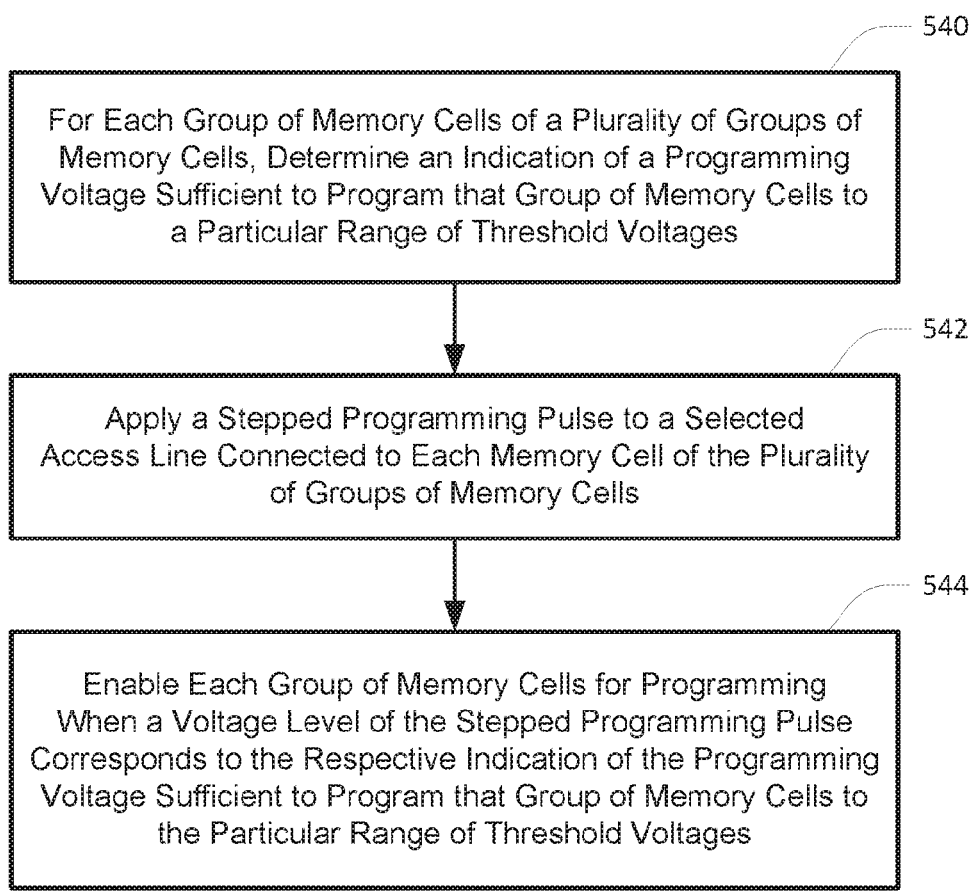
FIG. 5 depicts a flowchart of a method of operating a memory according to an embodiment.

The distribution of threshold voltages 403 resulting from the discovery programming pulse provides information indicative of programming voltages sufficient to program memory cells of the distribution of threshold voltages 403 to a particular threshold voltage, or to program groups of memory cells of the distribution of threshold voltages 403 to a particular range of threshold voltages, e.g., a range of threshold voltages corresponding to an intended data state. This may facilitate programming these memory cells to threshold voltages corresponding to their intended data state with only a single additional programming pulse. FIG. 5 depicts a flowchart of a method of operating a memory according to an embodiment making use of this information.

At 540, an indication of a programming voltage sufficient to program a group of memory cells to a particular range of threshold voltages is determined for each group of memory cells of a plurality of groups of memory cells. The groups of memory cells each correspond to some respective range of threshold voltages of the distribution of threshold voltages 403, i.e., the memory cells of a particular group of memory cells each have a threshold voltage within its respective range of threshold voltages. A voltage level of a programming pulse resulting in the distribution of threshold voltages 403, and a representative threshold voltage of the particular group of memory cells, can provide the indication of the programming voltage sufficient to program the particular group of memory cells to the particular range of threshold voltages. For example, a representative threshold voltage of a group of memory cells might be a lower value (e.g., lower limit) of its corresponding range of threshold voltages, an upper value (e.g., upper limit) of its corresponding range of threshold voltages, an average of its corresponding range of threshold voltages, etc. Within the particular group of memory cells, a particular voltage level of a programming pulse might be expected to shift each of the threshold voltages of the particular group of memory cells by an amount that might be deemed to be equal.

At 542, a stepped programming pulse is applied to a selected access line (e.g., word line) connected to each memory cell of the plurality of groups of memory cells. Note that the selected access line might be connected to memory cells not included in the plurality of groups of memory cells, e.g., not selected for programming or addressed by the programming operation. The stepped programming pulse may have a series of successively different (e.g., lower or higher) voltage levels, including a respective voltage level for each group of memory cells of the plurality of groups of memory cells. At 544, when a voltage level of the stepped programming pulse corresponds to the respective indication of the programming voltage sufficient to program a group of memory cells to the particular range of threshold voltages, that group of memory cells is enabled for programming. This may be repeated for each group of memory cells of the plurality of groups of memory cells. Groups of memory cells not corresponding to the voltage level of the stepped programming pulse might be inhibited from programming.

FIGS. 6A-6D depict a method of determining VgVt for memory cells of a distribution of threshold voltages 403 and programming those memory cells to their intended data state according to an embodiment. It is noted that FIGS. 6A-6D may depict theoretical expectations applied to normal distributions. However, the concepts described can be applied regardless of the shape of the distributions. Furthermore, while the discussion of FIGS. 6A-6D utilizes eight threshold voltage ranges 611 for simplicity, the number of threshold voltage ranges 611 may be fewer or greater. It is noted, however, that increasing numbers of threshold voltage ranges may provide for more narrow distributions of threshold voltages after programming. For example, where the width of the distribution of threshold voltages 403 is 4 volts, sixteen threshold voltages ranges 611 might facilitate a threshold voltage range after programming of approximately 250 millivolts.

Figure 6A:
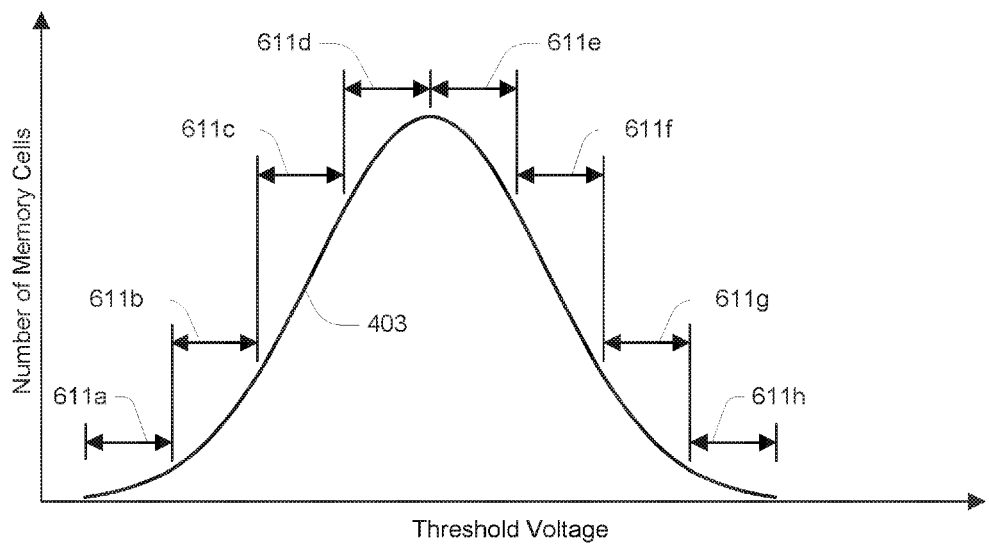
FIGS. 6A-6D depict a method of determining VgVt for memory cells of a distribution of threshold voltages and programming those memory cells to their intended data state according to an embodiment.

Following generation of the distribution of threshold voltages 403, i.e., following application of the discovery programming pulse to an access line selected for a programming operation, a plurality of groups of memory cells are identified. These groups represent portions of the memory cells of the distribution of threshold voltages 403 having threshold voltages within respective threshold voltages ranges 611a-611h as depicted in FIG. 6A. For example, those memory cells within distribution of threshold voltages 403 and having a threshold voltage within the threshold voltage range 611a might correspond to a first group of memory cells, those memory cells within distribution of threshold voltages 403 and having a threshold voltage within the threshold voltage range 611b might correspond to a second group of memory cells, those memory cells within distribution of threshold voltages 403 and having a threshold voltage within the threshold voltage range 611c might correspond to a third group of memory cells, and so on.

Identification of the groups of memory cells can be accomplished by sensing (e.g., reading) the memory cells of the distribution of threshold voltages 403 at different read voltages. Sensing of memory cells generally involves applying a particular voltage level (e.g., read voltage) to an access line connected to memory cells selected for sensing, and detecting whether one or more of the memory cells are activated in response to the read voltage, such as by sensing a change in voltage levels or current levels of respective data lines connected to the selected memory cells. For example, a read voltage having a particular voltage level (e.g., a voltage level of the bottom of the threshold voltage range 611b) might be applied to the access line connected to the memory cells of the distribution of threshold voltages 403, and those memory cells for which activation is detected might be assigned to the group of memory cells corresponding to the threshold voltage range 611a. The voltage level of the read voltage might then be increased (e.g., to a voltage level of the bottom of the threshold voltage range 611c), and those additional memory cells for which activation is detected might be assigned to the group of memory cells corresponding to the threshold voltage range 611b. This process can be repeated until each of the respective groups of memory cells corresponding to the threshold voltage ranges 611a-611h are identified. Note that sensing with a read voltage at the top of the threshold voltage range 611h may be unnecessary where threshold voltage range 611h is sufficiently high that it can be presumed there are no memory cells having threshold voltages above the threshold voltage range 611h. In such a case, each memory cell of the distribution of threshold voltages 403 that was not previously activated can be assigned to the group of memory cells corresponding to the threshold voltage range 611h.

Information indicative as to which group of memory cells a particular memory cell corresponds might be stored in a latch, register or other storage media, e.g., other memory cells of the array of memory cells. Using the example of FIG. 6A, where the threshold voltage range of the distribution of threshold voltages 403 is segmented into eight threshold voltage ranges 611, a three-bit latch or register could store information indicative of the corresponding group for a particular memory cell. Although the threshold voltage ranges 611 are depicted in FIG. 6A to have a combined width coinciding with the width of the distribution of threshold voltages 403, it may be beneficial to have threshold voltage ranges 611 extending beyond the expected width of the distribution of threshold voltages 403 to mitigate the possibility of a selected memory cell having a threshold voltage of less than the lowest threshold voltage range, e.g., threshold voltage range 611a in this example, or greater than the highest threshold voltage range, e.g., threshold voltage range 611h in this example.

Each of the identified groups of memory cells may be associated with a representative threshold voltage, and thus a particular value of VgVt. For example, a representative threshold voltage of a group of memory cells might be a lower value of its corresponding threshold voltage range 611, an upper value of its corresponding threshold voltage range 611, an average of its corresponding threshold voltage range 611, etc. The value of VgVt for a particular group of memory cells can then be determined as the voltage level of the discovery programming pulse minus the representative threshold voltage of that group of memory cells. This group of memory cells might then be programmed to an intended data state using a subsequent programming pulse (e.g., a subsequent programming pulse having multiple decremented steps) having a voltage level (e.g., of a plurality of voltage levels) determined from the value of VgVt for that group of memory cells and a threshold voltage (e.g., an intended threshold voltage) corresponding to the intended data state. For example, the subsequent programming pulse might have a voltage level calculated from (e.g., the sum of) the value of VgVt and the threshold voltage (e.g., a lower threshold voltage) of the intended data state. It is noted that the value of VgVt used for determining the voltage level of the subsequent programming pulse may be the determined VgVt for that group of memory cells or it may be a corrected value, e.g., calculated from some defined function of a representative threshold voltage of the intended data state. For some embodiments, the representative threshold voltage of the intended data state, or intended range of threshold voltages, is a lower value (e.g., lower limit) of the intended data state. This representative threshold voltage might, for example, correspond to a voltage level of a verify pulse used to verify if a memory cell has been sufficiently programmed to indicate the intended data state.

Figure 6B:
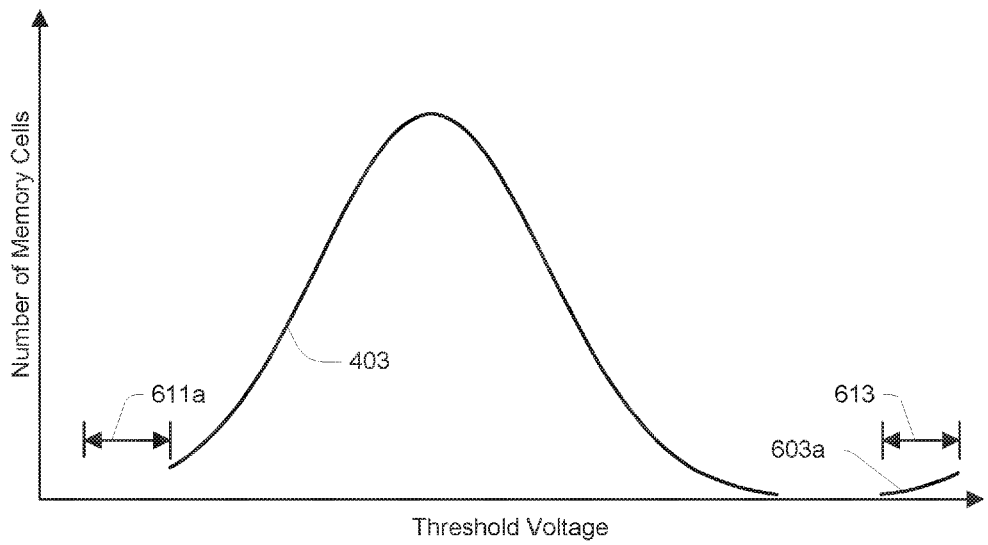

FIG. 6B depicts such programming of the group of memory cells corresponding to the threshold voltage range 611a. Following application of the subsequent programming pulse, those memory cells corresponding to the threshold voltage range 611a might have their threshold voltages shifted to a threshold voltage range 613, which might be within an intended threshold voltage range, resulting in a distribution of threshold voltages 603a. The shift in threshold voltages may be a linear shift, thus resulting in a distribution having a same (e.g., similar) shape as that portion of the distribution of threshold voltages 403 corresponding to the threshold voltage range 611a. Memory cells connected to the selected access line and in groups not corresponding to the threshold voltage range 611a, or otherwise not selected for programming, might be inhibited from programming during this portion of the programming operation.

Figure 6C:
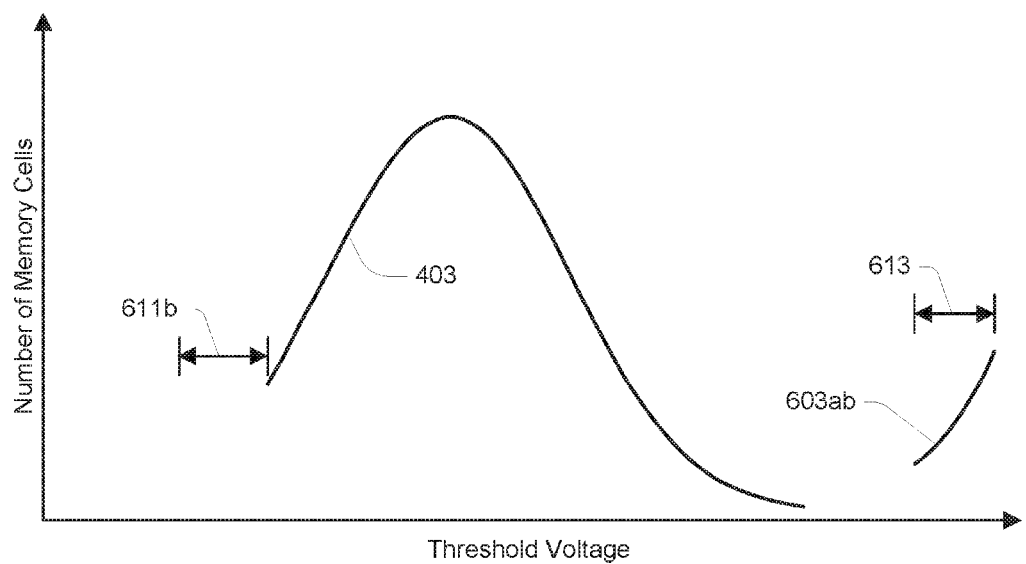

FIG. 6C depicts programming of the group of memory cells corresponding to the threshold voltage range 611b. For programming of the group of memory cells corresponding to the threshold voltage range 611b, the voltage level of the subsequent programming pulse can be decreased. For example, the voltage level might be decreased by a value corresponding to (e.g., equal to) the VgVt for the group of memory cells corresponding to the threshold voltage range 611a minus the VgVt for the group of memory cells corresponding to the threshold voltage range 611b. This value might be equal to a width of the threshold voltage ranges 611. Alternatively, the decreased voltage level of the subsequent programming pulse can be determined using values of VgVt calculated from the defined function of the particular threshold voltage of the intended data state. Regardless of how the voltage level of the subsequent programming pulse is determined, those memory cells corresponding to the threshold voltage range 611b might have their threshold voltages shifted to the threshold voltage range 613 as a result. The resulting distribution of threshold voltages 603ab represents a sum of the portions of the distribution of threshold voltages 403 corresponding to the threshold voltage ranges 611a and 611b. Memory cells connected to the selected access line and in groups not corresponding to the threshold voltage range 611b, or otherwise not selected for programming, might be inhibited from programming during this portion of the programming operation.

Figure 6D:
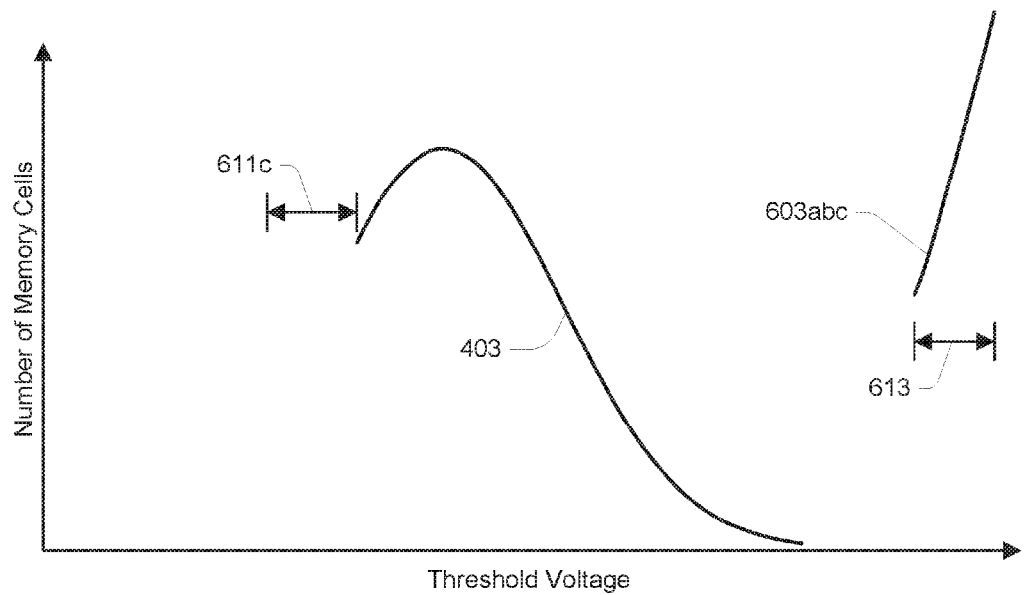

FIG. 6D depicts such programming of the group of memory cells corresponding to the threshold voltage range 611c. For programming of the group of memory cells corresponding to the threshold voltage range 611c, the voltage level of the subsequent programming pulse can be decreased. For example, the voltage level might be decreased by a value corresponding to (e.g., equal to) the VgVt for the group of memory cells corresponding to the threshold voltage range 611b minus the VgVt for the group of memory cells corresponding to the threshold voltage range 611c. This value might be equal to a width of the threshold voltage ranges 611. Alternatively, the decreased voltage level of the subsequent programming pulse can be determined using values of VgVt calculated from the defined function of the particular threshold voltage of the intended data state. Regardless of how the voltage level of the subsequent programming pulse is determined, those memory cells corresponding to the threshold voltage range 611c might have their threshold voltages shifted to the threshold voltage range 613 as a result. The resulting distribution of threshold voltages 603abc represents a sum of the portions of the distribution of threshold voltages 403 corresponding to the threshold voltage ranges 611a, 611b and 611c. Memory cells connected to the selected access line and in groups not corresponding to the threshold voltage range 611c, or otherwise not selected for programming, might be inhibited from programming during this portion of the programming operation.

The method described with respect to FIGS. 6B-6D can be repeated for each subsequent group of memory cells. Note that the slope of the distribution of threshold voltages 603abc may begin to decrease as subsequent groups of memory cells are programmed and added to the distribution, and may approximate a flat line, in theory, after all groups of memory cells are programmed. However, in view of natural variations, it may be expected that the resulting distribution of threshold voltages may more closely resemble a normal distribution extending beyond the threshold voltage range 613. Such variations might be mitigated by selecting the width of the threshold voltage range 613 to be less than the width of the threshold voltage range of the intended data state. In addition, as discussed subsequently, an additional programming pulse might be performed to narrow the resulting distribution.

Figure 7A:
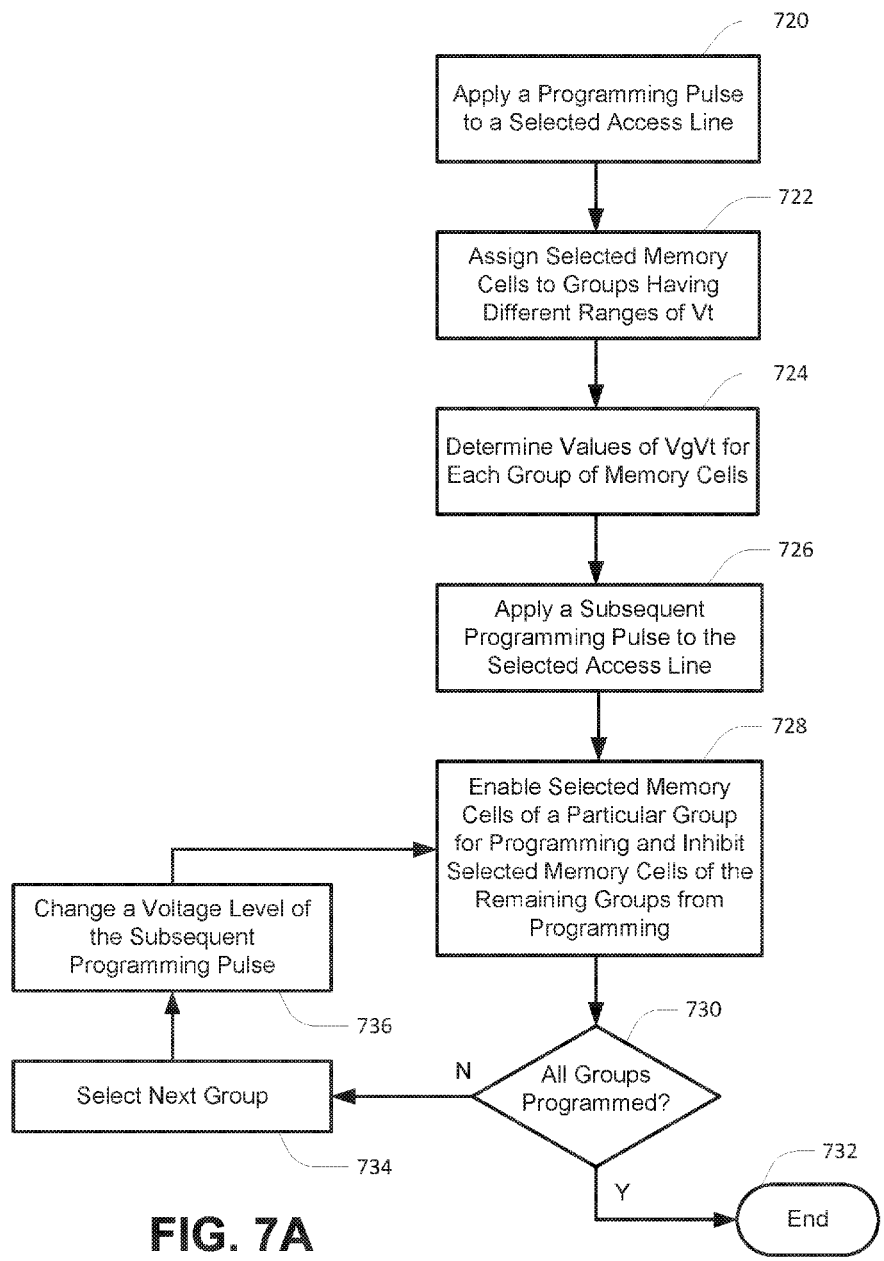
FIG. 7A depicts a flowchart of a method of operating a memory according to an embodiment.

FIG. 7A depicts a flowchart of a method of operating a memory according to an embodiment, and may represent a programming operation of the memory. At 720, a programming pulse (e.g., discovery programming pulse) is applied to an access line selected for programming. The programming pulse has a voltage level expected to cause a shift in threshold voltages of memory cells of the selected access line that are selected for programming. These selected memory cells are enabled for programming during application of this programming pulse, while other memory cells of the selected access line may be inhibited from programming. For example, the data lines connected to the selected memory cells might be biased to an enable voltage, e.g., 0V, while the data lines connected to the remaining memory cells might be biased to an inhibit voltage, e.g., Vcc.

At 722, the selected memory cells are assigned to respective groups of memory cells, each having a different range of threshold voltages. For example, the selected memory cells may be sensed to determine a particular range of threshold voltages to which a particular memory cell corresponds. This may be accomplished by applying a series of increasing voltage levels to the selected access line, and determining which of the selected memory cells are activated in response to each of the applied voltage levels, as described with reference to FIG. 6A. At 724, values of VgVt are determined for each group of memory cells. For example, a representative threshold voltage corresponding to a particular group of memory cells might be subtracted from the voltage level of the programming pulse applied to the selected access line, as described with reference to FIG. 6A.

At 726, a subsequent programming pulse is applied to the selected access line. At 728, the selected memory cells of a particular group of memory cells are enabled for programming, while the selected memory cells of the remaining groups of memory cells are inhibited from programming. For example, the group of memory cells having the highest value of VgVt might be enabled for programming while the remaining groups of memory cells might be inhibited. The voltage level of the subsequent programming pulse might have a value expected to shift the threshold voltages of memory cells enabled for programming. For example, the voltage level of the subsequent programming pulse might have a value expected to shift the threshold voltages of the group of memory cells having the highest value of VgVt to a range of threshold voltages corresponding to an intended data state.

It is noted that while a particular voltage level might be determined to be expected to shift the threshold voltages of a group of memory cells to a range of threshold voltages corresponding to the intended data state, the nature of integrated circuit devices may not permit application of this exact voltage level. For example, a memory device may be configured to generate some finite number of different voltage levels for a programming pulse. As such, applying a selected voltage level (e.g., a nearest voltage level or next lower voltage level) of the finite number of different voltage levels for application to the selected access line in response to a determination of the particular voltage level expected to shift the threshold voltages of a group of memory cells to a range of threshold voltages corresponding to the intended data state, where that selected voltage level is also expected to shift the threshold voltages of the group of memory cells to a range of threshold voltages corresponding to the intended data state, is equivalent to applying the determined particular voltage level.

At 730 a decision is made whether all of the groups of memory cells have been programmed using the subsequent programming pulse, e.g., whether the programming operation is complete. If yes, the method can end at 732. If no, a next group of memory cells is selected at 734 and the voltage level of the subsequent programming pulse is changed at 736. The voltage level of the subsequent programming pulse is changed to a value corresponding to the group of memory cells selected at 734. For example, the group of memory cells having the next lower value of VgVt might be selected, and the voltage level of the subsequent programming pulse might be decreased by a value corresponding to the difference between the VgVt (e.g., determined or corrected) of the prior group of memory cells and the VgVt (e.g., determined or corrected) of the next group of memory cells. For example, the voltage level of the subsequent programming pulse might be decreased to a value expected to shift the threshold voltages of the selected group of memory cells to a range of threshold voltages corresponding to the intended data state. Note that while the examples have used decreasing voltage levels of the subsequent programming pulse with decreasing values of VgVt, increasing voltage levels for the subsequent programming pulse might be used, such as by first selecting the group of memory cells having the lowest value of VgVt at 728, then selecting the group of memory cells having the next higher value of VgVt at 734. Other orders are also permissible. Note that the prior group of memory cells might be inhibited from programming prior to changing the voltage level of the subsequent programming pulse at 736.

In response to (e.g., after or with) changing the voltage level of the subsequent programming pulse at 736, the selected memory cells of the next group of memory cells are enabled for programming while the selected memory cells of the remaining groups of memory cells are inhibited from programming while the subsequent programming pulse is at the changed voltage level. This process loop of 728 to 736 can be repeated until all groups of memory cells have their respective memory cells programmed at their respective voltage levels of the subsequent programming pulse.

Figure 7B:
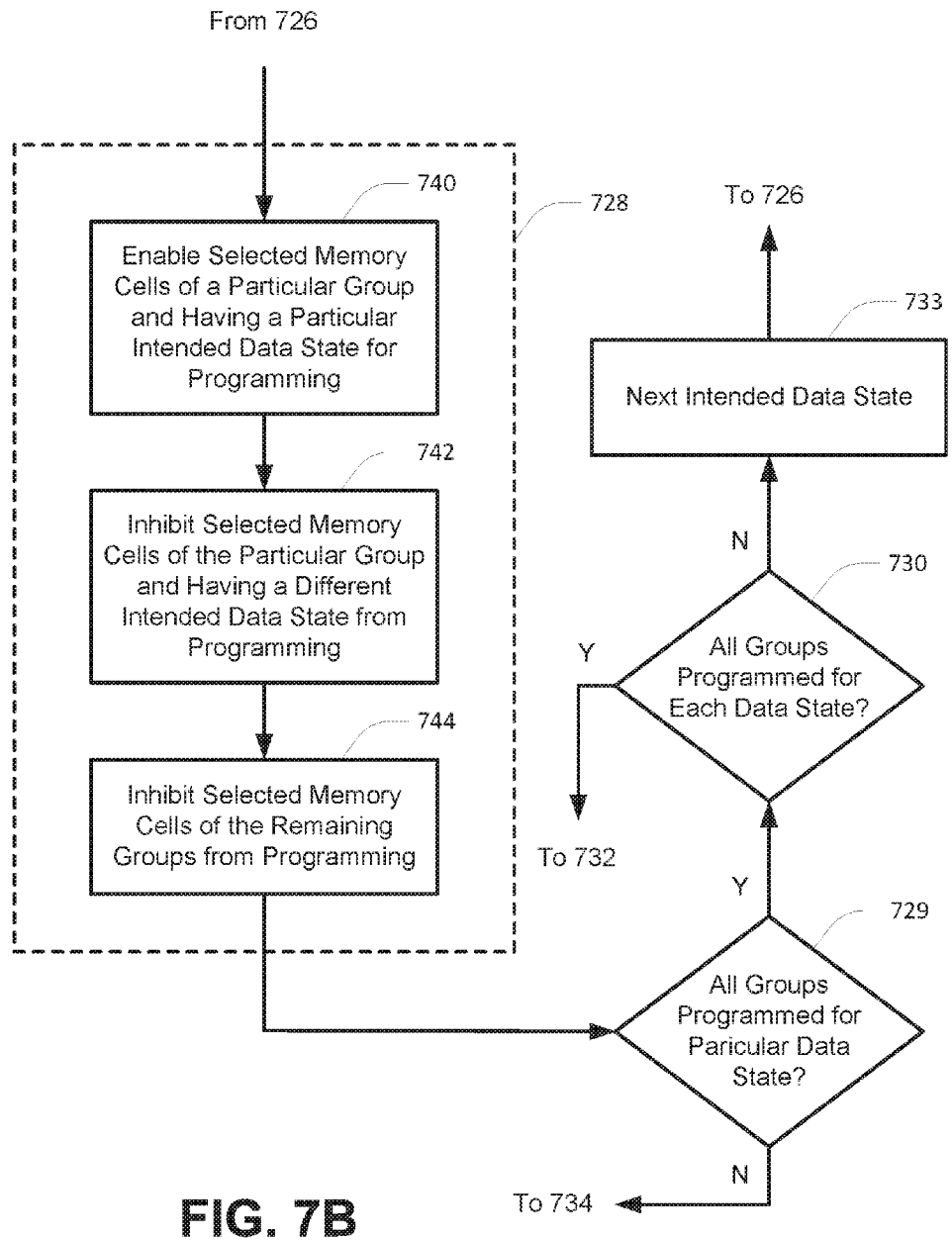
FIG. 7B depicts a portion of a flowchart of a variation of the method of FIG. 7A according to an embodiment.

Although the method described with reference to FIG. 7A utilized just one intended data state, multiple data states might be programmed in a particular programming operation. This might be accomplished by repeating the process of 728 to 730 for each data state, once for a first intended data state using a first subsequent programming pulse, and once for a second intended data state using a second subsequent programming pulse, and so on. This might be performed in order of increasing or decreasing threshold voltages of the intended data states, for example. To extend the method of FIG. 7A, blocks 728 and 730 might be modified as depicted in the variation of FIG. 7B. For example, at 728, those selected memory cells of a group of memory cells having a particular intended data state are enabled 740 for programming at a particular voltage level of the subsequent programming pulse. Those selected memory cells of that group of memory cells having a different intended data state may be inhibited 742 from programming at the particular voltage level of the subsequent programming pulse, while the selected memory cells of the remaining groups of memory cells are inhibited 744 from programming at the particular voltage level of the subsequent programming pulse.

At 729, a decision is made whether the selected memory cells having the particular intended data state for all of the groups have been programmed using the subsequent programming pulse. If no, the process continues to 734. If yes, the process continues to 730, where the decision is made whether all of the groups of memory cells have been programmed for each intended data state using the subsequent programming pulse. If yes, the method can end at 732. If no, a next intended data state is selected at 733 and a next subsequent programming pulse is applied to the selected access line at 726 to repeat the process of 728 to 730 for the next intended data state. The voltage level (e.g., initial voltage level) at 726 may be determined for each subsequent programming pulse as appropriate for the threshold voltage range of their respective intended data states. Note that the selected access line might not be discharged between iterations of the subsequent programming pulse.

Figure 8:
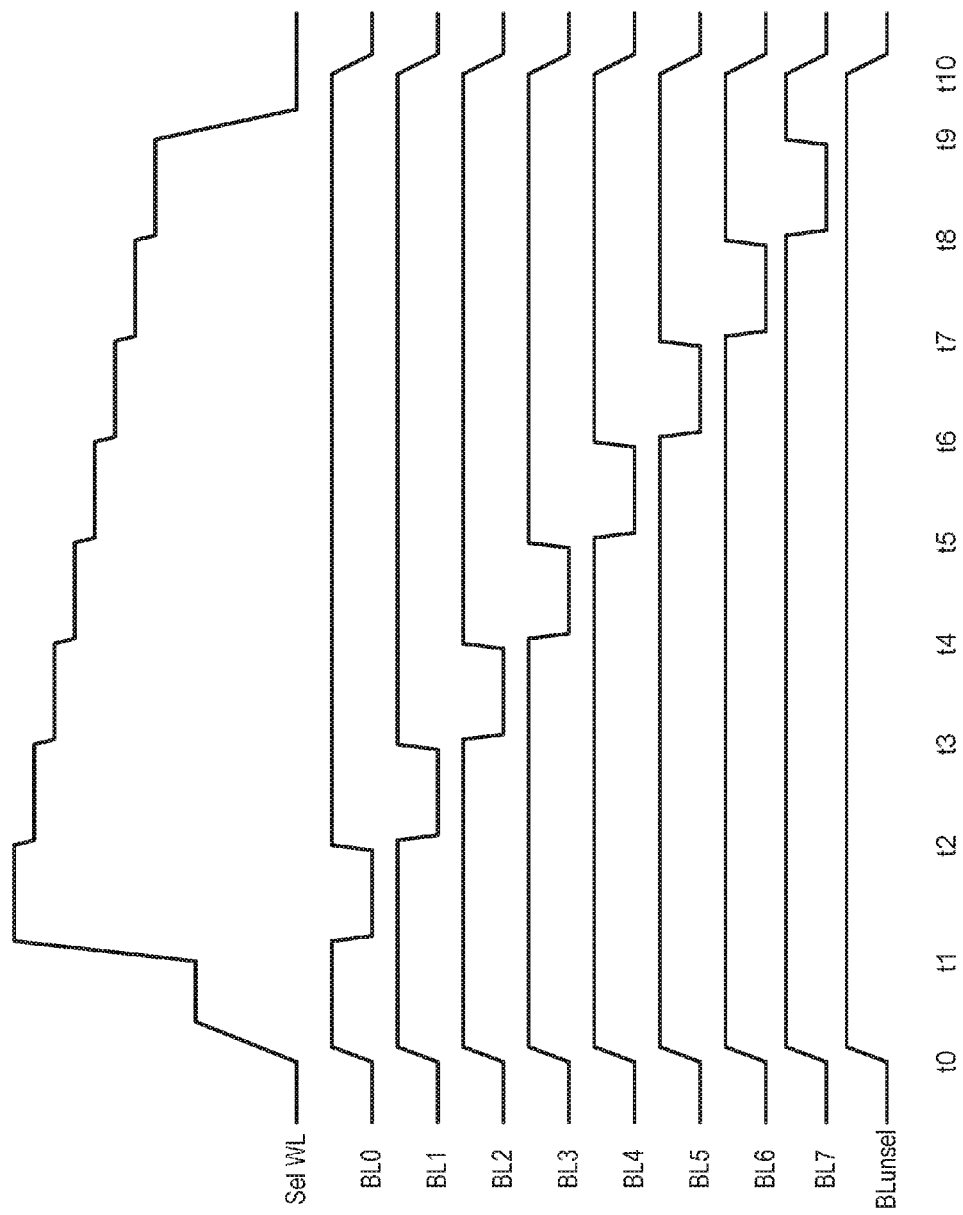
FIG. 8 conceptually depicts waveforms of voltage levels for various nodes in performing a method such as described with reference to FIG. 7A according to an embodiment.

FIG. 8 conceptually depicts waveforms of voltage levels for various nodes in performing a method such as described with reference to FIG. 7A. The embodiment of FIG. 8 utilizes eight groups of memory cells corresponding to eight threshold voltage ranges, such as described with reference to FIGS. 6A-6D. Sel WL corresponds to the voltage level of the selected access line (e.g., selected word line). BL0-BL7 each correspond to the voltage levels of the groups of data lines (e.g., bit lines) selectively connected to selected memory cells of a respective group of memory cells having different values of VgVt. BLunsel corresponds to data lines (e.g., bit lines) selectively connected to memory cells for which no change in data state is desired during the programming operation (i.e., unselected memory cells), or to memory cells connected to the selected access line that are not addressed by the programming operation.

At time t0, BL0-BL7 and BLunsel might be raised to an inhibit voltage, e.g., Vcc, while Sel WL might be raised to an intermediate voltage level. The intermediate voltage level of Sel WL is often utilized during programming operations to reduce the power needed to raise the voltage level of Sel WL to its intended voltage level. For example, raising Sel WL to the intermediate voltage level, and then raising Sel WL to its intended voltage level while raising unselected access lines (not shown in FIG. 8) to some pass voltage, may consume less power than simply raising Sel WL to its intended voltage level in one step. It is noted that a variety of schemes are known for increasing a voltage level of a selected access line to its intended voltage level and for operating unselected access lines connected to a same string of memory cells as the selected access line. However, details of such schemes are not important to understanding the concepts disclosed herein.

At time t1, Sel WL is raised to a voltage level expected to program memory cells of the group of memory cells corresponding to BL0 (e.g., those memory cells having threshold voltages corresponding to the threshold voltage range 611$a$) to a range of threshold voltages corresponding to an intended data state. The voltage level of BL0 might also be changed to the enable voltage, e.g., 0V, to enable programming of the corresponding group of memory cells. The voltage level of BL0 might subsequently be returned to the inhibit voltage, e.g., at or before time t2.

At time t2, Sel WL is decremented to a voltage level expected to program memory cells of the group of memory cells corresponding to BL1 (e.g., those memory cells having threshold voltages corresponding to the threshold voltage range 611$b$) to a range of threshold voltages corresponding to the intended data state. The voltage level of BL1 might also be changed to the enable voltage, e.g., 0V, to enable programming of the corresponding group of memory cells. The voltage level of BL1 might subsequently be returned to the inhibit voltage, e.g., at or before time t3.

At time t3, Sel WL is decremented to a voltage level expected to program memory cells of the group of memory cells corresponding to BL2 (e.g., those memory cells having threshold voltages corresponding to the threshold voltage range 611$c$) to a range of threshold voltages corresponding to the intended data state. The voltage level of BL2 might also be changed to the enable voltage, e.g., 0V, to enable programming of the corresponding group of memory cells. The voltage level of BL2 might subsequently be returned to the inhibit voltage, e.g., at or before time t4.

At time t4, Sel WL is decremented to a voltage level expected to program memory cells of the group of memory cells corresponding to BL3 (e.g., those memory cells having threshold voltages corresponding to the threshold voltage range 611$d$) to a range of threshold voltages corresponding to the intended data state. The voltage level of BL3 might also be changed to the enable voltage, e.g., 0V, to enable programming of the corresponding group of memory cells. The voltage level of BL3 might subsequently be returned to the inhibit voltage, e.g., at or before time t5.

At time t5, Sel WL is decremented to a voltage level expected to program memory cells of the group of memory cells corresponding to BL4 (e.g., those memory cells having threshold voltages corresponding to the threshold voltage range 611$e$) to a range of threshold voltages corresponding to the intended data state. The voltage level of BL4 might also be changed to the enable voltage, e.g., 0V, to enable programming of the corresponding group of memory cells. The voltage level of BL4 might subsequently be returned to the inhibit voltage, e.g., at or before time t6.

At time t6, Sel WL is decremented to a voltage level expected to program memory cells of the group of memory cells corresponding to BL5 (e.g., those memory cells having threshold voltages corresponding to the threshold voltage range 611$f$) to a range of threshold voltages corresponding to the intended data state. The voltage level of BL5 might also be changed to the enable voltage, e.g., 0V, to enable programming of the corresponding group of memory cells. The voltage level of BL5 might subsequently be returned to the inhibit voltage, e.g., at or before time t7.

At time t7, Sel WL is decremented to a voltage level expected to program memory cells of the group of memory cells corresponding to BL6 (e.g., those memory cells having threshold voltages corresponding to the threshold voltage range 611$g$) to a range of threshold voltages corresponding to the intended data state. The voltage level of BL6 might also be changed to the enable voltage, e.g., 0V, to enable programming of the corresponding group of memory cells. The voltage level of BL6 might subsequently be returned to the inhibit voltage, e.g., at or before time t8.

At time t8, Sel WL is decremented to a voltage level expected to program memory cells of the group of memory cells corresponding to BL7 (e.g., those memory cells having threshold voltages corresponding to the threshold voltage range 611$g$) to a range of threshold voltages corresponding to the intended data state. The voltage level of BL7 might also be changed to the enable voltage, e.g., 0V, to enable programming of the corresponding group of memory cells. The voltage level of BL7 might subsequently be returned to the inhibit voltage, e.g., at or before time t9. At time t10, Sel WL, BL0-BL7 and BLunsel might be discharged with the programming operation complete.

Figure 9A:
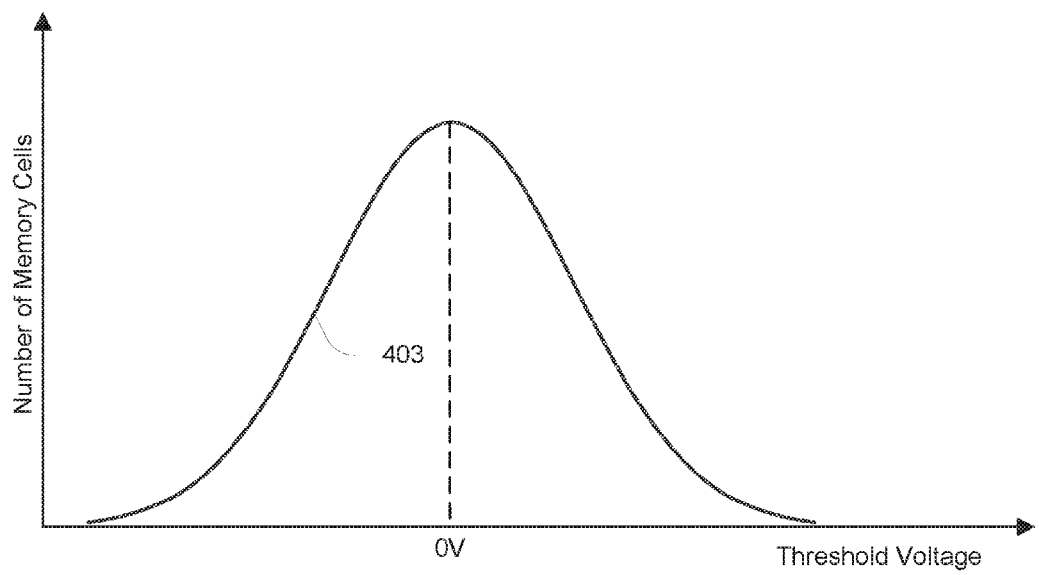
FIGS. 9A-9B depict an alternate method of determining VgVt for memory cells of a distribution of threshold voltages including negative threshold voltages according to an embodiment.
Figure 9B:
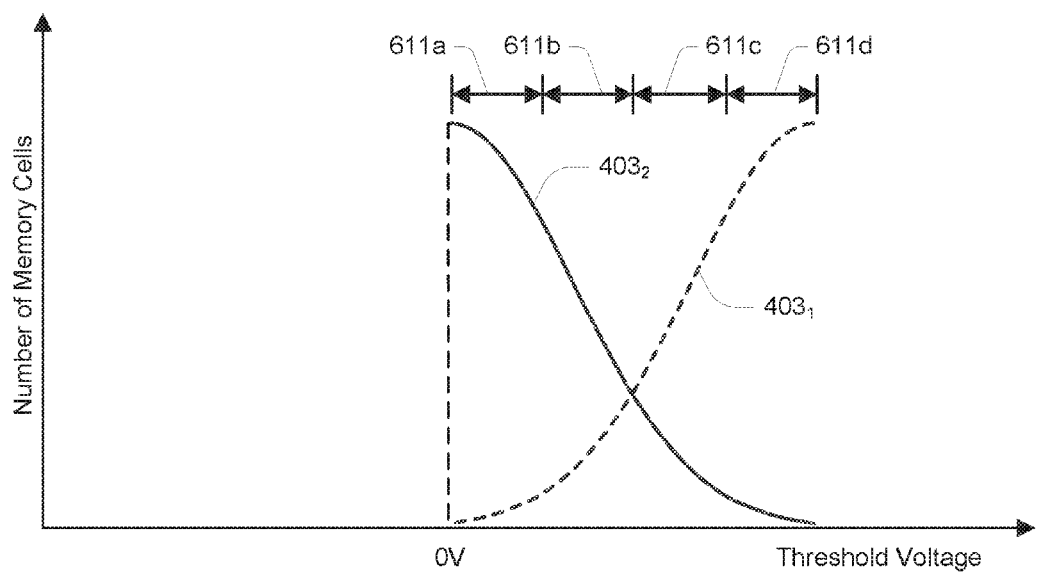

As noted previously, the distribution of threshold voltages 403 following the discovery programming pulse might encompass negative threshold voltages. If reliable methods of sensing negative threshold voltages are not available within a particular memory device, the grouping of memory cells into threshold voltage ranges might be performed in more than one step. FIGS. 9A-9B depict an alternate method of determining VgVt for memory cells of a distribution of threshold voltages including negative threshold voltages according to an embodiment.

As depicted in FIG. 9A, following application of the discovery programming pulse, a portion of the resulting distribution of threshold voltages 403 lies below the 0V level of threshold voltage while a portion lies above. A first sensing of the memory cells corresponding to the distribution of threshold voltages 403 is performed using a read voltage of 0V to determine whether each memory cell has a threshold voltage of 0V or higher, or a threshold voltage less than 0V. An additional discovery programming pulse is then applied to the memory cells determined to have threshold voltages less than 0V to shift their distribution higher. For example, this additional programming pulse might have a voltage level expected to shift the threshold voltages of each memory cell having a threshold voltage less than 0V to a threshold voltage of 0V or higher, such as represented by distribution of threshold voltages $403_1$. Those memory cells determined to have threshold voltages of 0V or higher following the first discovery programming pulse might be represented by distribution of threshold voltages $403_2$.

Following application of the additional discovery programming pulse, a plurality of groups of memory cells are identified. These groups represent portions of the memory cells of the distribution of threshold voltages $403_1$ having threshold voltages within respective threshold voltages ranges 611a-611d, and of the distribution of threshold voltages $403_2$ having threshold voltages within respective threshold voltages ranges 611a-611d, as depicted in FIG. 9B. For example, those memory cells within distribution of threshold voltages $403_1$ and having a threshold voltage within the threshold voltage range 611a might correspond to a first group of memory cells, those memory cells within distribution of threshold voltages $403_1$ and having a threshold voltage within the threshold voltage range 611b might correspond to a second group of memory cells, those memory cells within distribution of threshold voltages $403_1$ and having a threshold voltage within the threshold voltage range 611c might correspond to a third group of memory cells, and those memory cells within distribution of threshold voltages $403_1$ and having a threshold voltage within the threshold voltage range 611d might correspond to a fourth group of memory cells, each having a respective VgVt determined using the voltage level of the additional discovery programming pulse.

To continue with the example, those memory cells within distribution of threshold voltages $403_2$ and having a threshold voltage within the threshold voltage range 611a might correspond to a fifth group of memory cells, those memory cells within distribution of threshold voltages $403_2$ and having a threshold voltage within the threshold voltage range 611b might correspond to a sixth group of memory cells, those memory cells within distribution of threshold voltages $403_2$ and having a threshold voltage within the threshold voltage range 611c might correspond to a seventh group of memory cells, and those memory cells within distribution of threshold voltages $403_2$ and having a threshold voltage within the threshold voltage range 611d might correspond to an eighth group of memory cells, each having a respective VgVt determined using the voltage level of the first discovery programming pulse. Programming of memory cells of the identified groups of memory cells using a stepped programming pulse may now be performed, such as described with reference to FIGS. 5-8.

Figure 10:
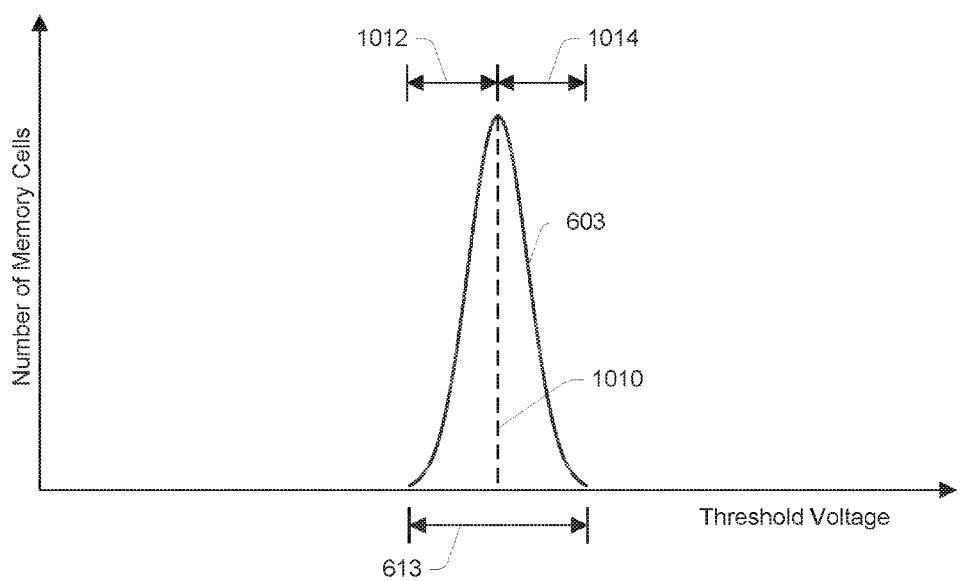
FIG. 10 depicts a method of reducing a width of a distribution of threshold voltages for use with various embodiments.

FIG. 10 depicts a method of reducing a width of a distribution of threshold voltages for use with various embodiments. The distribution of threshold voltages 603 might represent the resulting distribution of completing the programming of each group of memory cells, such as described with reference to FIGS. 6A-6D. The distribution of threshold voltages 603 might have a width 613. To reduce this width, thus resulting in a more narrow distribution, a sensing of the memory cells corresponding to the distribution of threshold voltages 603 could be performed using a read voltage having a voltage level equal to the voltage level occurring at 1010 to determine which memory cells have threshold voltages in the threshold voltage range 1012 and which memory cells have threshold voltages in the threshold voltage range 1014. An additional programming pulse is then applied to the memory cells determined to have threshold voltages in the threshold voltage range 1012. For example, this additional programming pulse might have a voltage level expected to shift the threshold voltages of each memory cell having a threshold voltage in threshold voltage range 1012 to a threshold voltage in threshold voltage range 1014. The additional programming pulse might be a stepped programming pulse such as described with reference to FIGS. 5-8.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory, comprising:
for each group of memory cells of a plurality of groups of memory cells, determining a respective indication of a programming voltage sufficient to program that group of memory cells to a particular range of threshold voltages;
applying a stepped programming pulse having a plurality of different voltage levels to a selected access line connected to each memory cell of the plurality of groups of memory cells; and
while applying the stepped programming pulse, enabling each group of memory cells of the plurality of groups of memory cells for programming when a voltage level of the stepped programming pulse corresponds to the respective indication of the programming voltage sufficient to program that group of memory cells to the particular range of threshold voltages.

2. The method of claim 1, wherein determining the respective indication of the programming voltage sufficient to program a particular group of memory cells to the particular range of threshold voltages comprises determining a value of VgVt for the particular group of memory cells.

3. The method of claim 2, wherein determining the value of VgVt for the particular group of memory cells comprises applying a programming pulse having a particular voltage level to the selected access line while the memory cells of at least the particular group of memory cells are enabled for programming, and subtracting a resulting representative threshold voltage of the particular group of memory cells from the particular voltage level.

4. The method of claim 3, wherein the programming pulse having the particular voltage level is a second programming pulse, and further comprising applying a first programming pulse having a voltage level less than the particular voltage level to the selected access line while the memory cells of at least the particular group of memory cells are enabled for programming, and determining that at least some memory cells of the particular group of memory cells have negative threshold voltages prior to applying the second programming pulse.

5. A method of operating a memory, comprising:
for each group of memory cells of a plurality of groups of memory cells, determining an indication of a programming voltage sufficient to program that group of memory cells to a particular range of threshold voltages;
applying a stepped programming pulse to a selected access line connected to each memory cell of the plurality of groups of memory cells; and
enabling each group of memory cells for programming when a voltage level of the stepped programming pulse corresponds to the respective indication of the programming voltage sufficient to program that group of memory cells to the particular range of threshold voltages;
wherein determining the indication of the programming voltage sufficient to program a particular group of memory cells to the particular range of threshold voltages comprises determining a value of VgVt for the particular group of memory cells;
wherein determining the value of VgVt for the particular group of memory cells comprises applying a programming pulse having a particular voltage level to the selected access line while the memory cells of at least the particular group of memory cells are enabled for programming, and subtracting a resulting representative threshold voltage of the particular group of memory cells from the particular voltage level; and
wherein subtracting the resulting representative threshold voltage of the particular group of memory cells from the particular voltage level comprises subtracting a threshold voltage selected from a group consisting of a lower value of a range of threshold voltages corresponding to the particular group of memory cells, an upper value of the range of threshold voltages corresponding to the particular group of memory cells, and an average of the range of threshold voltages corresponding to the particular group of memory cells.

6. The method of claim 3, further comprising calculating a corrected value of VgVt for the particular group of memory cells in response to a function of a representative threshold voltage of the particular range of threshold voltages.

7. The method of claim 1, wherein applying the stepped programming pulse having the plurality of different voltage levels to the selected access line comprises applying a programming pulse having a series of successively lower voltage levels.

8. A method of operating a memory, comprising:
for each group of memory cells of a plurality of groups of memory cells, determining a respective indication of a programming voltage sufficient to program that group of memory cells to a particular range of threshold voltages, wherein determining the indication for a particular group of memory cells of the plurality of memory cells comprises determining a value of VgVt for the particular group of memory cells of the plurality of memory cells;
applying a stepped programming pulse having a plurality of different voltage levels to a selected access line connected to each memory cell of the plurality of groups of memory cells, wherein steps of the programming pulse have voltage levels determined in response to the indication of a programming voltage sufficient to program respective groups of memory cells of the plurality of groups of memory cells to the particular range of threshold voltages; and
while applying the stepped programming pulse, enabling each group of memory cells of the plurality of groups of memory cells for programming when the voltage level of the stepped programming pulse corresponds to the respective indication of the programming voltage sufficient to program that group of memory cells to the particular range of threshold voltages.

9. The method of claim 1, wherein enabling each group of memory cells of the plurality of groups of memory cells for programming when a voltage level of the stepped programming pulse corresponds to the respective indication of the programming voltage sufficient to program that group of memory cells to the particular range of threshold voltages comprises enabling no more than one group of memory cells of the plurality of groups of memory cells for programming at any voltage level of the stepped programming pulse.

10. The method of claim 1, wherein enabling a particular group of memory cells of the plurality of groups of memory cells for programming when a voltage level of the stepped programming pulse corresponds to the respective indication of the programming voltage sufficient to program the particular group of memory cells to the particular range of threshold voltages comprises enabling only those memory cells of the particular group of memory cells that are selected for programming to a particular intended data.

11. A method of operating a memory, comprising:
for each group of memory cells of a plurality of groups of memory cells, determining a respective indication of a programming voltage sufficient to program that group of memory cells to a first range of threshold voltages corresponding to a first intended data state and determining a respective indication of a programming voltage sufficient to program that group of memory cells to a second range of threshold voltages corresponding to a second intended data state;
applying a first stepped programming pulse having a plurality of different voltage levels to a selected access line connected to each memory cell of the plurality of groups of memory cells, wherein steps of the first stepped programming pulse have voltage levels determined in response to the respective indications of a programming voltage sufficient to program each group of memory cells of the plurality of groups of memory cells to the first range of threshold voltages;
while applying the first stepped programming pulse, enabling each group of memory cells of the plurality of groups of memory cells for programming while applying the first stepped programming pulse when a voltage level of the first stepped programming pulse corresponds to the respective indication of the programming voltage sufficient to program that group of memory cells to the first range of threshold voltages, wherein enabling a group of memory cells of the plurality of groups of memory cells for programming while applying the first stepped programming pulse comprises enabling memory cells of that group of memory cells that are selected for programming to the first intended data state;
after applying the first stepped programming pulse having a plurality of different voltage levels to the selected access line, applying a second stepped programming pulse, different than the first stepped programming pulse and having a plurality of different voltage levels, to the selected access line; and while applying the second stepped programming pulse, enabling each group of memory cells of the plurality of groups of memory cells for programming while applying the second stepped programming pulse when a voltage level of the second stepped programming pulse corresponds to the respective indication of the programming voltage sufficient to program that group of memory cells to the second range of threshold voltages, wherein enabling a group of memory cells of the plurality of groups of memory cells for programming while applying the second stepped programming pulse comprises enabling memory cells of that group of memory cells that are selected for programming to the second intended data state.

12. The method of claim 11, further comprising not discharging the selected access line between applying the first stepped programming pulse and applying the second programming pulse.

13. The method of claim 11, wherein an initial voltage level of the first stepped programming pulse is different than an initial voltage level of the second programming pulse.

14. The method of claim 11, further comprising:
for each group of memory cells of a plurality of groups of memory cells, determining a respective indication of a programming voltage sufficient to program that group of memory cells to a third range of threshold voltages corresponding to a third intended data state;
after applying the second stepped programming pulse to the selected access line, applying a third stepped programming pulse, different from the second stepped programming pulse and having a plurality of different voltage levels, to the selected access line; and
while applying the third stepped programming pulse, enabling each group of memory cells of the plurality of groups of memory cells for programming while applying the third stepped programming pulse when a voltage level of the third stepped programming pulse corresponds to the respective indication of the programming voltage sufficient to program that group of memory cells to the third range of threshold voltages, wherein enabling a group of memory cells of the plurality of groups of memory cells for programming while applying the third stepped programming pulse comprises enabling memory cells of that group of memory cells that are selected for programming to the third intended data state.

15. The method of claim 11, wherein enabling each group of memory cells of the plurality of groups of memory cells for programming while applying the first stepped programming pulse when a voltage level of the first stepped programming pulse corresponds to the respective indication of the programming voltage sufficient to program that group of memory cells to the first range of threshold voltages comprises:
enabling a particular group of memory cells of the plurality of groups of memory cells for programming while applying the first stepped programming pulse when a voltage level of the first stepped programming pulse corresponds to the respective indication of the programming voltage sufficient to program the particular group of memory cells to the first range of threshold voltages;
after enabling the particular group of memory cells for programming while applying the first stepped programming pulse, enabling a subsequent group of memory cells of the plurality of groups of memory cells for programming while applying the first stepped programming pulse when a voltage level of the first stepped programming pulse corresponds to the respective indication of the programming voltage sufficient to program the subsequent group of memory cells to the first range of threshold voltages; and
prior to enabling the subsequent group of memory cells for programming while applying the first stepped programming pulse, inhibiting the particular group of memory cells from programming while applying the first stepped programming pulse.

16. The method of claim 15, wherein enabling each group of memory cells of the plurality of groups of memory cells for programming while applying the second stepped programming pulse when a voltage level of the second stepped programming pulse corresponds to the respective indication of the programming voltage sufficient to program that group of memory cells to the second range of threshold voltages comprises:
enabling the particular group of memory cells of the plurality of groups of memory cells for programming while applying the second stepped programming pulse when a voltage level of the second stepped programming pulse corresponds to the respective indication of the programming voltage sufficient to program the particular group of memory cells to the second range of threshold voltages;
after enabling the particular group of memory cells for programming while applying the second stepped programming pulse, enabling a subsequent group of memory cells of the plurality of groups of memory cells for programming while applying the second stepped programming pulse when a voltage level of the second stepped programming pulse corresponds to the respective indication of the programming voltage sufficient to program the subsequent group of memory cells to the second range of threshold voltages; and
prior to enabling the subsequent group of memory cells for programming while applying the second stepped programming pulse, inhibiting the particular group of memory cells from programming while applying the second stepped programming pulse.

17. The method of claim 11, wherein determining the respective indication of a programming voltage sufficient to program a particular group of memory cells to the first range of threshold voltages and determining the respective indication of a programming voltage sufficient to program the particular group of memory cells to the second range of threshold voltages each comprise determining a value of VgVt for the particular group of memory cells.

18. The method of claim 17, wherein determining the value of VgVt for the particular group of memory cells comprises applying a programming pulse having a particular voltage level to the selected access line while the memory cells of at least the particular group of memory cells are enabled for programming, and subtracting a resulting representative threshold voltage of the particular group of memory cells from the particular voltage level.

19. The method of claim 18, further comprising calculating a first corrected value of VgVt for the particular group of memory cells in response to a function of a representative threshold voltage of the first range of threshold voltages and calculating a second corrected value of VgVt for the particular group of memory cells in response to a function of a representative threshold voltage of the second range of threshold voltages.

20. The method of claim 16, wherein applying the first stepped programming pulse comprises applying the first stepped programming pulse having a series of successively lower voltage levels, and wherein applying the second stepped programming pulse to the selected access line comprises applying the second stepped programming pulse having a series of successively lower voltage levels.

* * * * *